US006510530B1

(12) United States Patent
Wu et al.

(10) Patent No.: US 6,510,530 B1
(45) Date of Patent: Jan. 21, 2003

(54) AT-SPEED BUILT-IN SELF TESTING OF MULTI-PORT COMPACT SRAMS

(75) Inventors: Yuejian Y. Wu, Kanata (CA); Liviu Calin, Ottawa (CA)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 09/401,976

(22) Filed: Sep. 23, 1999

(51) Int. Cl.[7] .................................................. G06F 11/27

(52) U.S. Cl. ............................ 714/30; 714/42; 714/718

(58) Field of Search ........................... 714/42, 30, 719, 714/718, 733, 735, 736; 365/200, 201

(56) References Cited

U.S. PATENT DOCUMENTS

| | | | | |
|---|---|---|---|---|
| 4,969,148 A | | 11/1990 | Nadeau-Dostie et al. ..... 371/21 |
| 5,579,322 A | * | 11/1996 | Onodera ..................... 714/718 |
| 5,668,815 A | * | 9/1997 | Gittinger et al. ............ 714/719 |
| 5,781,480 A | | 7/1998 | Nogle et al. |
| 5,796,745 A | | 8/1998 | Adams et al. |
| 5,812,469 A | | 9/1998 | Nadeau-Dostie et al. ... 365/201 |
| 5,896,330 A | * | 4/1999 | Gibson ....................... 365/201 |
| 5,912,850 A | * | 6/1999 | Wood et al. ................ 365/190 |
| 6,070,256 A | * | 5/2000 | Wu et al. .................... 365/201 |
| 6,353,903 B1 | * | 3/2002 | Adams et al. .............. 714/724 |

FOREIGN PATENT DOCUMENTS

JP 01 162299 6/1989

OTHER PUBLICATIONS

Patent Abstracts of Japan vol. 013, No. 430 (p–937), 1–7, 9, 13.

Matsumura T: "An Efficient Test Method for Embedded Multi–Port Ram with Bist Circuitry" Records of the International Workshop on Memory Technology, Design and Testing, Aug. 7, 1995 pp. 62–67, XP002069406 Los Alamitos, CA US the whole document.

Rochit Rajsuman; RAMBIST Builder: A Methodology for Automatic Built–in–Self–Test Design of Embedded RAMs, 1996.

Allan L. Silburt, et al.; A 180–MHz 0.8–$\mu$m BiCMOS Modular Memory Family of DRAM and Multiport SRAM, Mar. 1993.

Manuel J. Raposa; Dual Port Static Ram Testing, 1988 International Test Conference.

Yeujian Wu and Sanjay Gupta; Built–In Self–Test for Multi–Port RAMs, 1997.

V. Castro Alves, M. Nicolaidis, P. Lestrat and B. Courtois; Built–In Self–Test For Multi–Port RAMs, 1991.

* cited by examiner

*Primary Examiner*—Scott Baderman (57) ABSTRACT

A built-in self test (BIST) for a multi-port compact sRAM (CsRAM) uses a BIST controller which operates at the speed of the system, while the CsRAM is tested at the memory speed. The circuitry for testing allows multiple random accesses of the CsRAM per system clock cycle. In this way, timing-related defects in the CsRAM can be detected. The CsRAM is virtually partitioned into "k" sections, the sections being tested simultaneously from different ports with identical and complementary test data. A conventional (BIST) controller can be used with minimal addition of hardware in a collar arranged around the memory array.

22 Claims, 6 Drawing Sheets

AT-SPEED BUILT-IN SELF TESTING OF MULTI-PORT COMPACT SRAMS

BACKGROUND OF THE INVENTION

1. Field of the Invention

The present invention is generally concerned with a method and apparatus for testing memories and in particular with a Built-In Self Test (BIST) for at-speed testing of multi-port compact static random access memories (CsRAMs).

2. Description of the Related Art

A RAM (random access memory) comprises a plurality of storage elements or cells, and a number of ports for each cell. Generally, a port includes five connections accessible to the external equipment, namely a data-in, a data-out, a clock, an address, and a control (write/read) connection. For a one-port memory, the cells are accessed sequentially, according to the address, and a data bit (0 or 1) is written or read in/from the respective cell.

New generation of ASICs for the telecommunications industry requires larger and faster memories. To deal with the increased demand of data processing, compact sRAMs (CsRAMs) were developed, which reduce the silicon area and the peak power consumption of conventional memories. Compact static RAMs are currently used in ASICs on a large scale, due to their higher yields, lower costs, and faster access time.

A CsRAM is a multi-port memory design methodology, where a set of read/write and address decoding circuitry is shared among multiple ports in a time slice fashion. In other words, in a single system clock cycle, each port is given a fraction of the cycle time to access the memory through the same read/write circuitry as well as the same address decoder. Compared to a conventional multi-port memory, a CsRAM that supports the same number of ports as a conventional one occupies significantly less silicon area.

Conventionally, testing of a memory device comprises writing a data pattern at a predetermined location, reading the data out from the respective location and comparing it with the data that should have been written into that location.

In the past, memory devices were tested at the manufacturing site using an external tester that supplied control signals, address signals, and data signals to the memory under test, and also did the evaluation of the output data in order to determine whether the memory passes or fails.

As the density of the memory cells on a single chip increases, so does the need to test the circuits after they are packaged in an ASIC. A fault, which is not detected during manufacturing test, will result in unexpected failures in the field. However, testing memory chips is not an easy task. For example, the number of connections with the outside equipment is limited. A straightforward implementation of multiple physical ports throughout the memory is prohibitively complex and unpractical.

Testing of embedded memory blocks in ASICs is very challenging. Firstly, high-speed memories use a small differential signal swing, so that special test algorithms must be used, making detection of shorts difficult. In addition, as the scale of the integrated circuits increases, so does the number and type of errors. As a result, the number of test patterns required for testing various types of defects, as well as the duration of execution of the pattern also grow with the memory size.

Furthermore, accessing the memory for writing and reading, then comparing the response is a major challenge when the array is buried deep down in the logic. As a result, the test patterns required for fault evaluation of high speed memories become more sophisticated, which in turn increases the test time and the size of chip. A general solution to this problem is to embed additional test circuits into the chip itself and to perform a built-in self test (BIST). Inclusion of a BIST in the ASIC is an elegant method to obtain very high fault coverage with minimum test time.

Current BIST controllers include a finite state machine (FSM) that provides for a specific sequence of write, read, and compare operations. The test may be conducted by the user whenever needed, or it can be automatically initiated at start up. As used throughout the disclosure, "BIST" refers to the actual test, while "BIST controller" refers to the circuitry that performs the BIST.

Methods for testing CsRAMs comprise a two part test, the first part being a scan test for the control logic of the CsRAM, and the second part being a conventional BIST for testing the memory itself. Although this method has a good coverage for static defects in both the control logic and the memory, it misses many timing-related defects in the memory.

To summarize, conventional memory test methodologies do not yield a satisfactory coverage when applied to CsRAMs. This is mostly due to the fact that CsRAMs run at their internal clock which is many times faster than the system clock. Currently, CsRAMs are tested at the much lower system clock speed and therefore, many timing-related defects are not uncovered.

It is a need for a practical method for testing CsRAMs at full memory speed in order to detect all timing-related defects in the memory.

SUMMARY OF THE INVENTION

It is an object of the present invention to alleviate totally or in part the above-mentioned drawbacks of the prior art BIST controllers.

Another object of this invention is to detect most or all timing-related defects in CsRAMs, using a standard Built-in Self-Test (BIST) controller. The method according to the invention requires a minimal addition of test circuitry around a conventional memory array and minimal changes to the conventional test algorithm. It is to be understood that the present invention can also be implemented as a one-piece, dedicated BIST controller.

According to one aspect of the invention, a method for testing a 2-port compact static random access memory (CsRAM) at the working speed of said CsRAM, is provided. The method comprises a first testing session and a second testing session. The first session includes generating a first set of test data and a second set of test data which may be identical or complementary to the first set, simultaneously writing the first set of test data in a first section of the CsRAM, and the second set of test data in a second section, reading a first output data from the first section and a second output data from the second section, and comparing the first output and the second output with the respective first and second set of test data and declaring a fault whenever the first output differs from the first test data, or the second output differs from the second test data.

The second session includes simultaneously writing the first set of test data in the second section of the CsRAM, and the second set of test data in the first section, reading the first output data from the second section and the second output data from the first section, and comparing again each output with respective first and second set of test data and declaring a fault whenever the first output differs from the first test data or the second output differs from the second test data. The method for testing a 2-port CsRAM can be applied to the testing of multi-port CsRAMs.

According to another aspect of the invention, a test circuit for a CsRAM with a first and a second port is provided. The circuit comprises a first address multiplexer unit for the first port and a second address multiplexer unit for the second port for selecting one of a test address and a system address in a first and respectively a second section of said CsRAM, a first data multiplexer unit for the first port and a second data multiplexer unit for the second port for providing one of a test data word and a system data word in the first and respectively the second section, a first W/R multiplexer unit for the first port and a second W/R multiplexer unit for the second port, said W/R multiplexer units for providing one of a test write/read instruction and a system write/read instruction for both the first and second sections, and a built-in self test (BIST) controller for generating test addresses, test data word and test write/read instruction simultaneously on the first and second ports, and for receiving an output data from said CsRAM, to perform testing of said CsRAM at a memory working speed, which is faster than the system clock.

Advantageously, the method according to the invention detects most or all the timing-related defects in CsRAMs, that are not covered by conventional test methodology because the CsRAM is tested at the working speed of the memory.

BRIEF DESCRIPTION OF THE DRAWINGS

Other objects and advantages of the invention will become apparent upon reading the following detailed description in conjunction with the accompanying drawings in which.

Similar references will be used throughout the description to denote similar units.

DESCRIPTION OF THE PREFERRED EMBODIMENTS

Figure 1A:
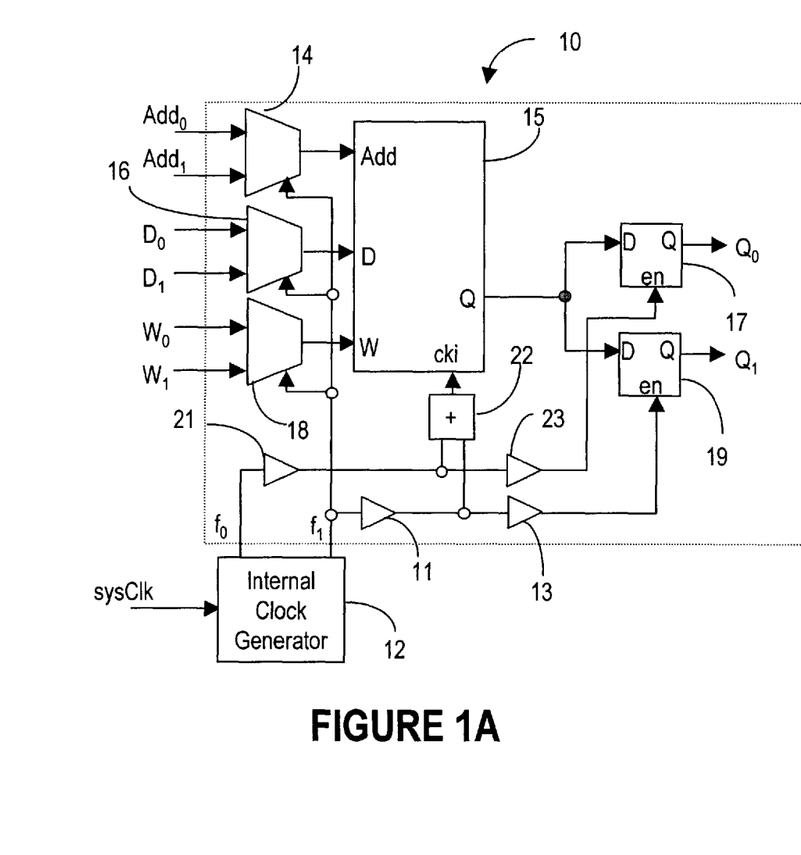
FIG. 1A shows the architecture of a 2-port compact sRAM (CsRAM)

FIG. 1A is a block diagram of a 2-port CsRAM 10. In FIG. 1A, sRAM 15 is a conventional single port static RAM. Input multiplexers 14, 16, 18, and latches 17, 19 at the output of sRAM 15 are used to convert a single port sRAM 15 in a 2-port CsRAM. An internal clock generator 12 uses the system clock sysClk to trigger the internal clocks $f_O$ and $f_I$ as it will be discussed later in connection with FIG. 2. Clocks $f_O$ and $f_I$ are added in adder 22 to obtain the memory clock cki. Clock $f_1$ is used to enable the input multiplexers 14, 16 and 18 for selecting the respective data address and control signals to the memory cell, and read/write the data from/into that cell. Clocks $f_0$ and $f_1$ are also used by output latches 17 and 19, respectively, to provide the data output for the respective one of the two ports $p_0$, $p_1$ of the CsRAM 10. Buffers 11, 13 and 21, 23 represent proper delays, and their configuration is determined by the technology used.

Figure 1B:
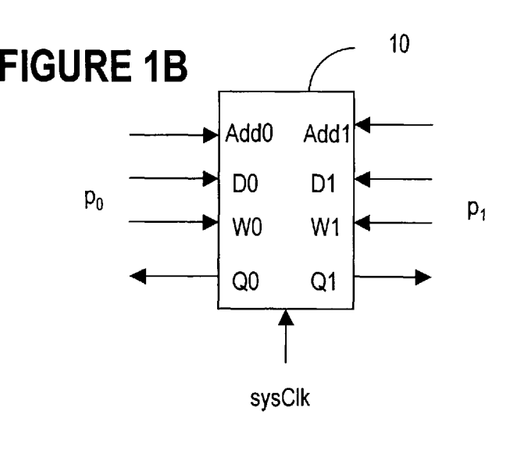
FIG. 1B shows the symbols used for a CsRAM.

FIG. 1B shows the symbols used to denote the inputs and outputs of the 2-port CsRAM 10. Signals $W_O$, $D_O$, $Add_O$, and $Q_O$ represent the write enable, data input, address, and data output for the first port $p_0$ Of the CsRAM 10. Similarly, signals $W_I$, $D_I$, $Add_I$, and $Q_I$ represent the write enable, data input, address, and data output for the second port $p_1$ of the CsRAM 10.

The operation of the 2-port CsRAM 10 is described in connection with FIGS. 1A, 1B, 2 and 3A. During each sysClk, signals $W_O/W_I$, $D_0/D_1$, and $Add_0/Add_1$ are presented to CsRAM 10 after an interval a from the sysClk rising edge. Initially, generator 12 produces a first pulse, $f_O$ as shown on FIG. 2. This $f_0$ pulse triggers access to cell 15' on the first port $p_0$, enabling lines $W_0$, $Add_0$ and $D_0$, since $f_I$, is 0 at this time. If $W_0$ is "1", a write operation writes $D_0$ into cell 15 at addresses pre-selected by $Add_0$. If $W_0$ is "0", a read operation reads the content of cell 15' and latches the result in the corresponding output latch 17.

Figure 2:
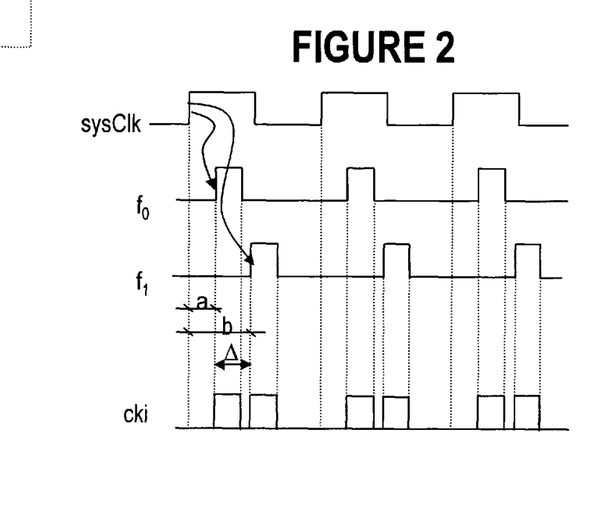
FIG. 2 illustrates the waveforms for the system clock and the internal clocks for testing the CsRAM of FIG. 1A, according to the invention.

After a certain delay with respect to the rising edge of the sysClk, shown as b on FIG. 2, the generator 12 produces the second clock pulse $f_I$. Pulse $f_I$ triggers the access to the cell 15' on at the second port $p_1$, enabling $W_I$, $Add_1$, and $D_1$. The phase difference between $f_O$ and is denoted with $\Delta$. It is to be understood that pulse $f_I$ can be generated by the rising edge of the sysClk, or by the rising edge of pulse $f_O$.

FIG. 2 shows the timing relationship between the system clock sysClk, and frequencies $f_O$ and $f_1$ used for testing 2-port CsRAM according to the invention. As indicated above, each rising edge of sysClk triggers a $f_O$ pulse and a $f_1$ pulse. The timing relationship between sysClk, $f_O$ and $f_I$ is fixed. In other words, the pulse width of $f_O$ and $f_I$ are fixed, the phase shifts (a and b) of $f_O$ and $f_I$ are also fixed with respect to the rising edge of sysClk, and $f_O$ and $f_I$ are independent of the cycle time of the sysClk. As a result, at each rising edge of sysClk, the CsRAM 10 is accessed twice at a fixed frequency of $1/\Delta$. Frequency $1/\Delta$ is usually the highest frequency that the sRAM technology allows, and is characteristic for each type of memory.

The use of CsRAMs has helped reduce silicon area of multi-port memories, thus allowing the integration of more functionality into an ASIC. Accordingly, the testing methods for CsRAMs are more challenging. As discussed before, it is difficult to achieve high test quality for CsRAMs with conventional BIST techniques, especially for timing-related faults, since the system clock is much slower than the internal clock (cki).

Figure 3A:
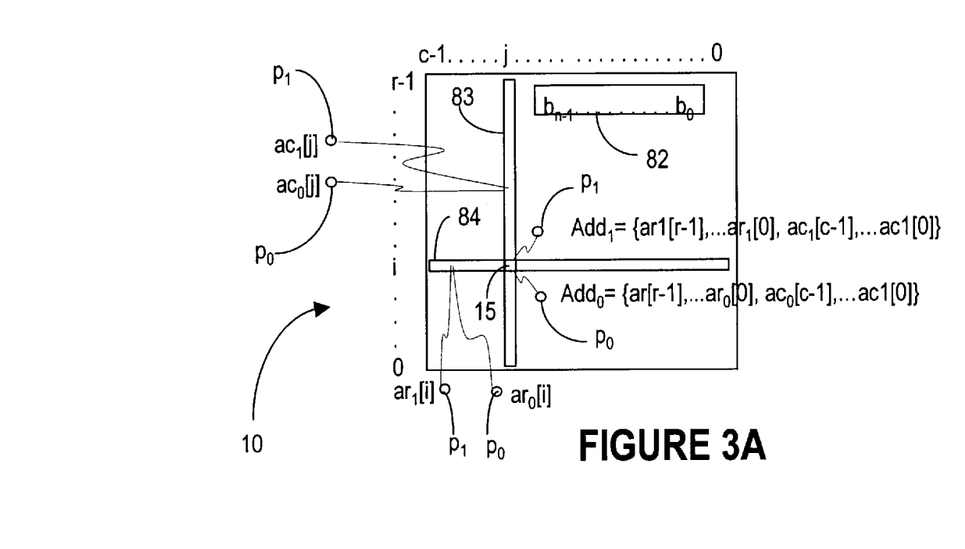
FIG. 3A illustrates the 2-port CsRAM of FIG. 1A and the terminology used by the method of testing according to the invention.
Figure 3B:
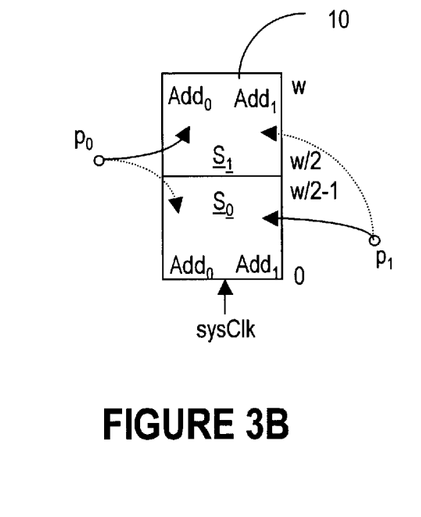
FIG. 3B illustrates a simplified 2-port CsRAM as viewed from the point of view of the testing method.

FIG. 3A illustrates a 2-port CsRAM 10 and is presented to define the terminology and the method of testing according to the invention. FIG. 3B is a simplified 2-port CsRAM 10 as viewed from the point of view of the testing method. It is to be understood that the method can be equally applied to a multiple port compact sRAM, and that the 2-port example is provided for explaining the basic idea for testing multi-port CsRAMs.

According to the present invention, for testing a k-port CsRAM working at a speed at least "k" times faster than the sysClk, the CsRAM is divided in "k" sections and is accessed "k" times, from "k" ports, during one system clock cycle ("k" a positive integer). Preferably, the memory is divided into equal sections. In the embodiment of FIG. 1A, a conventional single port sRAM 15 is partitioned into two equal sections, and can be accessed from two independent ports using the same system clock generator 12.

According to one embodiment of the invention, CsRAM 10 is logically partitioned into two sections of equal size, say sections $S_0$ and $S_1$. Each section $S_0$ and $S_1$ is simultaneously tested from different ports $p_0$, $p_1$ with identical or complementary test data.

The following notations are used for describing the testing method. The number of words, i.e. the size of the memory is denoted with "w", and "n" represents the number of bits per word per port. A word of "n" bits is exemplary shown at 82. CsRAM 10 is an array of "c" columns 83 and "r" rows 84. Index "i" is used for indicating the row address of a cell 15' and "i" could be 0, 1, 2, ... (r−1). Index "j" is used for indicating the column address of a cell 15', and "j" could be 0, 1, 2, ... (c−1).

As discussed above, there are two ports for each cell 15' in sRAM 15 and therefore, there are two different row addresses for a cell: one on port $p_1$ and another one on port p2. Thus, "$ar_0[i]$" and "$ar_1[i]$" represents the row addresses for same cell of sRAM 15 when accessed on port $p_0$ and $p_1$, respectively. Similarly, a cell 15' in sRAM 15 also has two different column addresses: one on port $p_0$ and another one on port $p_1$. Thus, "$ac_0[j]$ and $ac_1[j]$" represent column addresses for same cell 15.

The complete address of a cell 15' in sRAM 15 when accessed on port $p_0$ is:
$Add_0 = \{ar_0[r-I], \ldots, ar_0[0], ac_0[c-I], \ldots, ac_0[0]\}$
and the complete address of a cell in sRAM 15 when accessed on port $p_1$ is:
$Add_1 = \{ar_1[r-I], \ldots, ar_1[0], ac_1[c-1], \ldots, ac_1[0]\}$ FIG. 3B shows intuitively the CsRAM 10 separated into sections $S_0$ and $S_1$. For complete fault coverage, each port $p_0$, $p_1$ must test each section $S_0$ and $S_1$ once. In other words, two test sessions are needed for 2-port CsRAM 10. In the first session, $S_0$ is tested from $p_0$ simultaneously with the testing of section $S_1$ from $p_1$. This is shown in doted lines in FIG. 3B. In this case, $Add_0$ defines a cell location in section $S_0$ and $Add_1$ defines a cell location in section $S_1$. In the second test session, section $S_0$ is re-tested from $p_1$, simultaneously with testing section $S_1$ from $p_0$, to complete the test of the whole CsRAM 10. In the second test session, $Add_0$ defines a cell location in $S_1$ and $Add_1$ defines a cell location in $S_0$. This is shown in solid lines in FIG. 3B.

In addition, a parallel testing of the memory is assumed for this method, i.e. words are applied one at a time and test responses are read one word at a time. Therefore, this method is also referred to as the "modified parallel BIST".

The exemplary method of testing according to FIG. 3B does not impose extra test time by using two test sessions. This is because each test session tests only half of the memory space, thus taking only half of the test time as compared to a conventional approach for a single port sRAM that tests the complete memory space in a single session.

The two sessions of the testing method according to the invention may use the BIST used for testing sRAMs, such as the algorithm proposed by A. J. van de Goor ("Testing semiconductor memories", Wiley Publishers, April 1996) for a one-port sRAM, or by Wu et al. ("BIST for multi-port RAMs", pp. 1081–7735, 1997 IEEE) for multi-port conventional sRAMs.

According to the invention, these test algorithms, or others, can be slightly modified to test multi-port CsRAMs. As an example, this section presents a modified March "C" minors (MARCH C−) test algorithm used for the at-speed CsRAM testing according to the invention, but it is to be understood that the invention may be applied with minimal modifications to other BIST algorithms as well.

Figure 4:
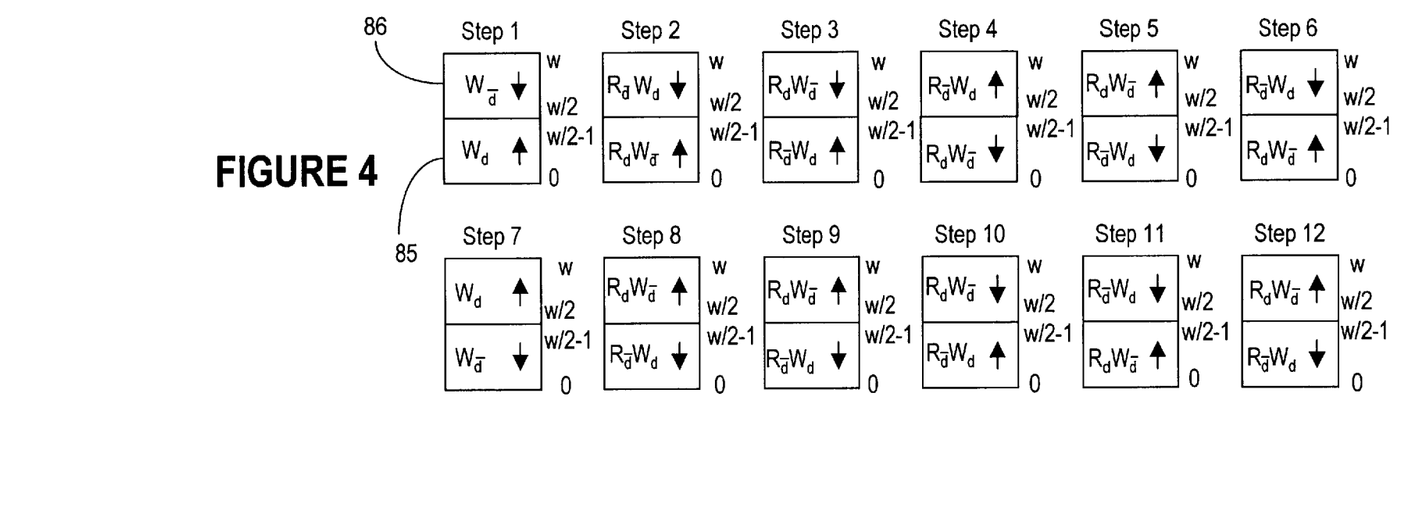
FIG. 4 illustrates the steps of the test for a 2-port CsRAM according to the invention.

FIG. 4 illustrates the steps of the test according to the invention. The steps are also called march steps, to intuitively describe that the cells are tested sequentially, writing and reading operations "marching" up or down from cell to cell. For testing a 2-port CsRAM 10 of "w" words and "n" bit per word per port, "r" rows and "c" columns, a conventional BIST controller is used to sequentially test two virtual single port sRAM's by accessing (testing) one sRAM at a time. Each virtual single port RAM has "w/2" words with "2n" bit per word arranged in (r−1) rows and "c" columns. Alternatively, the single port virtual memories may have w/2 words with "2n" bits per word arranged in "r" rows and (c−1) columns.

These virtual CsRAMs 85 and 86 are shown on FIG. 4 as a clear area and a grey area, respectively. It is to be understood that the separation into these two virtual memories is not permanent, and may change according to the march step performed during the test.

As a result of this virtual or logical separation, the collar for the conventional BIST controller must be slightly modified to provide 2n-bit wide test data and [(r−1)+c] bit addresses to the memory 10, and must check "2n" bit wide test responses. In addition, the conventional BIST controller must generate a memSel signal for selecting the single port virtual memories 85 and 86 of CsRAM 10 for the respective write/read operations. This memSel is used as the most significant bit of row address $ar_0[r-1]$ and $ar_1[r-1]$ for the CsRAM 10. For example, when first virtual sRAM 85 is tested from $p_0$, memSel=0, and when the second virtual sRAM 86 is tested from $p_0$, memSel=1.

On FIG. 4, letters R and W represent a read and respectively a write operation. Letters d and $\overline{d}$ represent test data and complementary test data written/read from a respective address. The arrows represent a march-up or a march-down for the respective step. The marching direction is indicated in the text by the indices "up" and "dn". $S_0$ or $S_1$ represent the section to which a write/read operation applies. Terms read-up and read-down, write-up and written-down indicate the direction of marching for an operation executed in the respective virtual memory.

Test data are applied at the rising edge of sysClk. Since the internal clock $f_0$ is generated first, test data on $D_0$ is initially applied to the cell at address $Add_0$ in virtual memory 85. Within the same sysClk cycle, test data on $D_1$ is applied to a cell at address $Add_1$ at the rising edge of $f_1$. As indicated above, $Add_0$ and $Add_1$, indicate two different storage cells, each in a different section of the memory 10.

In order to create transitions and thus cover timing-related faults, in the example of FIG. 4 test data on ports $p_0$ and $p_1$, have opposite, or complementary values, namely $D_1 = \overline{D}_0$. This means that if a logic "1" is written in a cell with address $Add_0$, a logic "0" is written in the cell at address $Add_1$, and so on. In this way, complementary test responses are read from addresses $Add_0$ and $Add_1$ with clocks $f_0$ and $f_1$ respectively, during read operations.

Due to the use of two sets of complementary test data for the two ports $p_0$, $p_1$ and different addresses, the signals on the D, Add, and Q lines of the CsRAM 10 are always switching for each pair of $f_0$ and $f_1$. This fast switching provides the maximum stress on the timing of the sRAM cell 15' and associated circuitry, such as the input multiplexers 14, 16, 18, and output latches 17, 19, shown in FIG. 1.

The method shown in FIG. 4 is executed in two sessions, with six steps in each of the first and second sessions.

The $1^{st}$ test session comprises steps 1–6, each step performing a read/write operation simultaneously and in opposite direction on each virtual memory. As indicated above, when test data d is read in a certain direction from virtual memory 85, complementary test data $\bar{d}$ is written in the same direction in its place. Also, when test data d is written in one direction in virtual memory 85, complementary test data $\bar{d}$ is written in opposite direction in virtual memory 86.

Step 1 indicates that the $1^{st}$ test session begins with writing w/2 test data words with increasingly successive addresses of virtual memory 85, and writing w/2 complementary test data words with decreasingly successive addresses of virtual memory 86. At the end of Step 1, the data written in virtual memories 85 and 86 have complementary values. The reading operation performed during Step 1 has no relevance to the testing method.

This could be expressed by:

Step 1: $\{(Wd)_{upSo}:(\overline{Wd})_{dnSI}\};$ // memory initialization for the $1^{st}$ session;
Step 2: $\{(Rd\overline{Wd})_{upSO}:(\overline{Rd}Wd)_{dnSI}\};$ // $1^{st}$ test session begins;
Step 3: $\{(\overline{Rd}Wd)_{upSo}:(Rd\overline{Wd})_{dnSI}\};$
Step 4: $\{Rd\overline{Wd}_{dnSO}:(\overline{Rd}Wd)_{upSI}\};$
Step 5: $\{(\overline{Rd}Wd)_{dnSO}:(Rd\overline{Wd})_{upSI}\};$
Step 6: $\{(Rd\overline{Wd})_{upSO}:(\overline{Rd}Wd)_{dnSI}\};$ // $1^{st}$ session completes;
where d can be any n-bit vector; such as 00 . . . 000 or 0101 . . . 0101;

Rd and $(\overline{Rd})$ represents a read $d(\bar{d})$ operation;

Wd($\overline{Wd}$) represents a write $d(\bar{d})$ operation;

( . . . ):( . . . ) represents two concurrent operations on the two ports;

the subscripts $upS_o$ ($dnS_0$) represents march up (down) test for section $S_0$; and subscripts $upS_1$ ($dnS_1$) represents march up (down) test for sections $S_1$.

The $2^{nd}$ test session begins with step 7, wherein w/2 test data words are written in increasingly successive addresses of virtual memory 86, and w/2 complementary test data words are written with decreasingly successive addresses of virtual memory 85. The data written in virtual memories 85 and 86 have opposite values, and the same rules as discussed above in connection with the first session apply. The reading operation performed during Step 7 has no relevance to the testing method.

This gives the following description of steps 7–12 of the second session:

Step 7: $\{(Wd)_{upSI}:(\overline{Wd})_{dnSO}\};$ // memory initialization for the $2^{nd}$ session;
Step 8: $\{(Rd\overline{Wd})_{upSI}:(\overline{Rd}Wd)_{dnSO}\};$ // $2^{nd}$ test session begins;
Step 9: $\{(\overline{Rd}Wd)_{upSI}:(Rd\overline{Wd})_{dnSO}\};$
Step 10: $\{(Rd\overline{Wd})_{dnSI}:(\overline{Rd}Wd)_{upSO}\};$
Step 11: $\{(\overline{Rd}Wd)_{dnSI}:(Rd\overline{Wd})_{upSO}\};$
Step 12: $\{(Rd\overline{Wd})_{upSI}:(\overline{Rd}Wd)_{dnSO}\};$ // test completed.

As shown above, each march operation is executed through the entire address space of the corresponding memory section, which is half of the memory space of the entire 2-port CsRAM 10. Depending on the partitioning of the memory, the succession of addresses for a march within each section may or may not be consecutive. For example, if the partition is such that $Add_0$ is the same as $Add_1$ in all bit positions except the most significant bit of their row addresses, then:

$ar_0[r-I]=ar_1[r-1]$, $ar_0[r-2]=ar_1[r-2]$, . . . , $ar_o[0]=ar_1[0]$, $ac_0[c-1]=ac_1[c-1]$, . . . , $ac_0[0]=ac_1[0]$, and the address within each memory section will be consecutive.

Irrespective of the partitioning of the memory and the succession of test addresses, the fault coverage according to the algorithm is the same. Again, testing is performed at the memory working speed, while the system continues to operate at the system clock speed.

Figure 5:
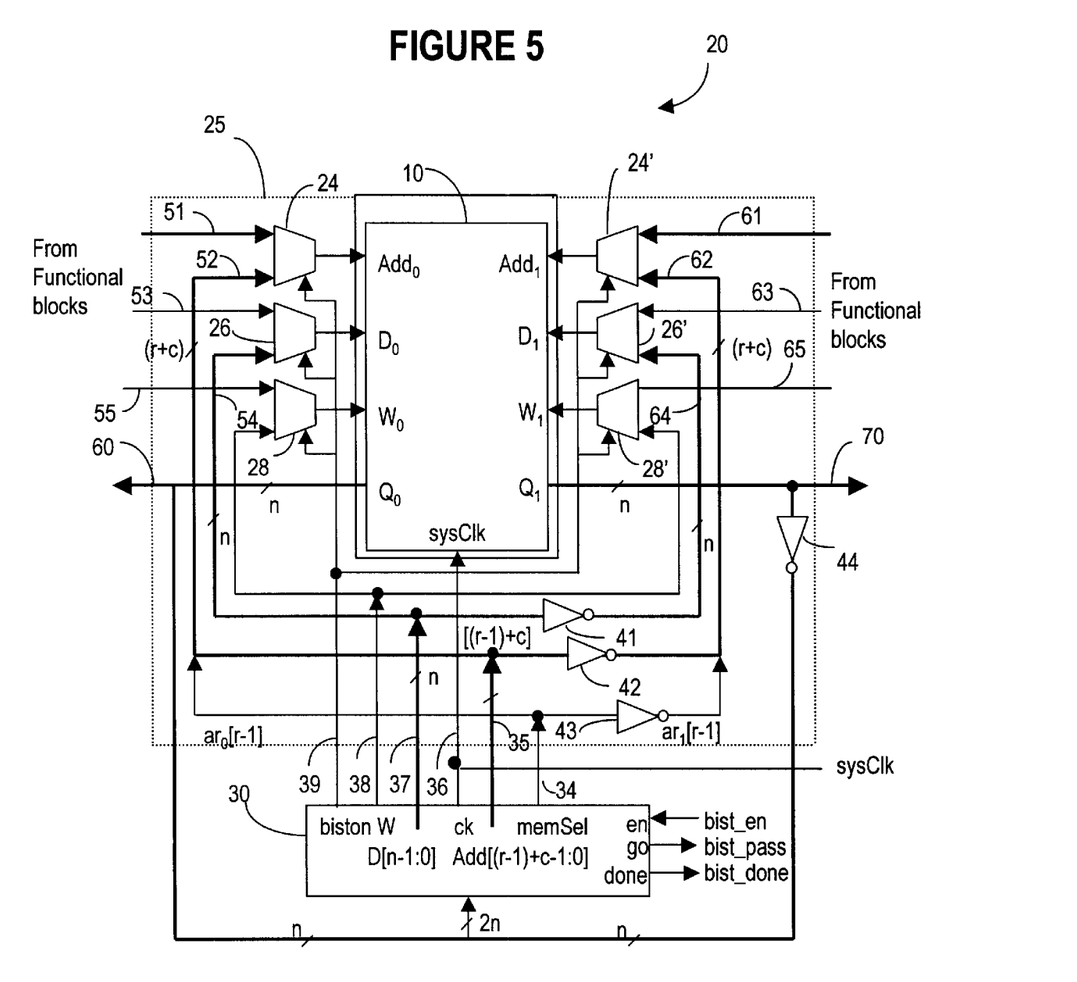
FIG. 5 is a parallel implementation of the at-speed BIST according to the invention, for a 2-port CsRAM.

FIG. 5 illustrates at 20 a modified collar 25 with a conventional BIST controller 30 for performing parallel BIST according to the invention. The connections in thicker lines illustrate a bus, and the size of the bus is also indicated on FIG. 5. The circuits in the area 25 shown in gray, are also defined herein as "the BIST collar". In this example, BIST controller 20 is adapted for testing a 2-port CsRAM 10. Nonetheless, other variants for collar 25 can be readily envisaged for other types of multi-port CsRAMs once the principle of operation and the circuitry for a 2-port CsRAM are understood. As also indicated above, an at-speed testing of the CsRAM 10 is achieved using collar 25 and with minor changes to the operation of the BIST controller 30.

Collar 25 comprises address multiplexers 24 and 24', data multiplexers 26 and 26' and W/R multiplexers 28 and 28', each for the respective function performed at a respective port $p_0$ or $p_1$. The collar 25 is connected to the remainder of the ASIC over lines 51, 53, 55 and 60 for port $p_0$ and over lines 61, 63, 65 and 70 for port $p_1$. The multiplexers are provided for allowing operation of CsRAM 10 in both normal mode, when it is connected to the functional blocks of the ASIC through the connections marked "from functional blocks", and in the test mode, through the connections to BIST controller 30.

Thus, the address multiplexer 24 for $p_0$ receives an address signal that is (r+c) bits wide, which identifies the row and column for a cell to be accessed in section $S_0$ of memory 10. Address multiplexer 24' for port $p_1$ also receives an address (r+c) bits wide, as the number of rows and columns of the memory are the same for both ports. The BIST controller 30 generates $[(r-1)+c]$ bit wide addresses to the memory 10 on line 35, for fully identifying each cell address in each section. In addition, BIST controller 30 provides memSel on line 34 and inverter 43 is provided for selecting between the first section $S_0$ and the second section $S_1$, this signal being, in this example, the most significant bit of the row address. In other words, memSel replaces $ar_0[r-1]$ and $ar_1[r-1]$. The addresses march-up or down for a respective port are obtained through inverter 42, located in collar 25. Inverter 42 also ensures that the addresses for simultaneous read and write operations on the two virtual memories are opposite. Inverter 44 allows the BIST controller 30 to compare identical sets of test responses.

The data multiplexers 26 and 26' receive "n" bits, where "n" is the size of a word. Therefore, BIST controller 30 must generate n-bit wide test data on line 37, which is again a consequence of the virtual separation of the memory 10 into two sections. Inverter 41 is used to always provide a second set of n-bit wide complementary test data on port $p_1$ with respect to port $p_0$. The R/W multiplexers 28 and 28' receive a single bit control signal 38 which indicate a read or a write operation. If the control signal is "1", a write operation is performed.

As explained in connection with FIG. 4, both virtual memories simultaneously effect read or write operation, but the addresses are marching in opposite directions, while the data have complementary values. Therefore, the control signal are the same for both ports. The test responses on output lines 60 and 70 are n-bit wide, and are used by the BIST controller 30 to check if the data written in a cell is identical to the data which is read from that cell. Both BIST controller 30 and CsRAM 10 are synchronized with the system clock sysClk shown at 36.

As mentioned before, the modified BIST controller 20 has a normal mode and a test mode of operation. Upon the arrival of bist–en=1, signal biston on line 39 selects the data from buffers/multiplexers (24, 26, 28) and (24', 26', 28'), and the BIST begins. Controller 30 first sets memSel at "0" and thus $ar_0[r-I]=0$ and $ar_1[r-1]=1$. In this case, the BIST controller 30 tests the lower half $S_0$ of the memory space through port $p_0$ and tests the higher half $S_1$ of the memory space through $p_1$, each one marching in opposite directions. During this session, the BIST executes the march steps 1–6 of FIG. 4, and completes a MARCH C– test for half of a conventional sRAM.

When the first test session completes, the BIST controller 30 sets memSel=1 and repeats the same MARCH C– test. During the second session, $ar_0[r-1]=1$ and $ar_1[r-1]=0$, and the BIST controller 30 tests the lower half $S_0$ of the memory space through $p_1$ and the higher half $S_1$ of the memory space through $p_0$. The second test session corresponds to the steps 7–12 described in connection with FIG. 4. When this test completes, the BIST controller 30 sets the signals bist_done and bist_pass, accordingly.

In terms of software changes compared to a conventional BIST controller, this implementation requires the conventional BIST controller 30 to generate at least n-bit wide test data and to check 2n-bit wide test responses.

In terms of hardware, there are (2n+r+c) invertors added in the BIST collar 25, namely (n) invertors 41, (n) invertors 44, and (r–1+c) invertors 42 and one inverter 43. It is to be noted that a conventional BIST controller requires the same amount of multiplexers as controller 20 of FIG. 5. In addition, both the silicon area in the ASIC and the associated overall peak power consumption decrease, as the invention is designed for testing of CsRAMs that are significantly smaller than the conventional compact sRAMs for the same capacity.

In terms of test time, the sequential test according to the invention requires the same amount of time as for the conventional testing of a single port sRAM of the same size. As compared to a 2-port sRAM conventional test, the test time according to the embodiment of FIG. 5 is only half.

While the modified BIST controller 20 requires more inverters as compared to a conventional BIST implementation, it also provides an additional n-bit wide test data to be used and therefore, the method of testing according to the invention provides for more accuracy as it uses twice as much test data and responses as compared to conventional methods. In addition, the test is performed at the memory working speed which is at least two times faster than the system clock, in order to cover timing-related faults.

Figure 6:
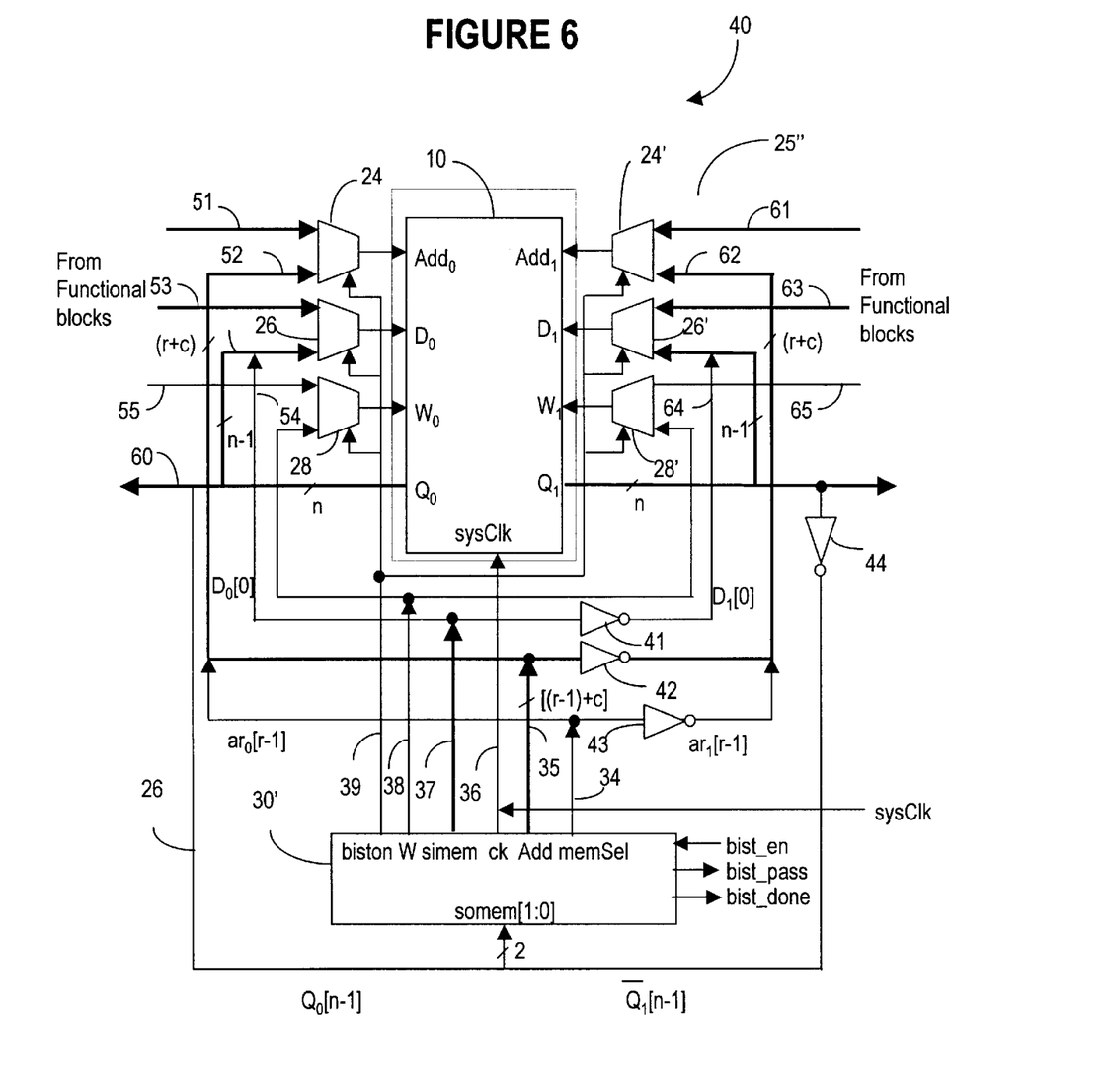
FIG. 6 shows serial implementation of the at-speed BIST according to the invention for a 2-port CsRAM.

FIG. 6 illustrates at 40 another embodiment of the invention, namely a serialized BIST controller used to test 2-port CsRAMs. This embodiment is recommendable for ASICs with a single BIST controller shared among a number of memories. If these memories are widely dispersed on an ASIC, a shared parallel BIST controller 20 as shown in FIG. 5, becomes expensive due to the cost of globally routing the test data bus.

The serialized memory BIST controller 40 of FIG. 6, minimizes this overhead by providing a single bit test input to all virtual memories and receiving a single bit test response from each virtual memory. In addition to the savings in routing, the serialization also reduces the hardware requirement of the BIST controller itself since it now generates a single bit test data to both ports of the CsRAM and receives a single bit test response from each port of the CsRAM.

The memory under test is in this example again a 2-port CsRAM 10 with "r" rows, "c" columns, "w" words, and "n" bits per word per port. The serial BIST controller 40 works with a serial MARCH (SMARCH) test described in U.S. Pat. No. 4,969,148 assigned to the same assignee as in the present invention, which is incorporated herein by reference.

The same principle illustrated in FIG. 4 can be applied to the serial implementation testing method by replacing all $(Rd\overline{Wd})$ and $(\overline{Rd}Wd)$ operations with $(ROW1)^n(R1W1)$ and $(R1W0)^n(R0W0)$, respectively.

In FIG. 6, the shaded area representing the serial BIST collar 25', comprises the address multiplexers (24, 24'), data multiplexers (26, 26'), the R/W multiplexers (28, 28'), and invertors 41–44. A single bit test data simem is applied on line 37 from the BIST controller 30' to the least significant bit $D_0[0]$ of port $p_0$ and a single bit test data $\overline{simem}$ is applied to the least significant bit $D_1[0]$ of port $p_1$. The remaining (n–1) bits of $D_0$ and $D_1$ are fed back from output lines $Q_0$ and $Q_1$ respectively. In other words $D_0=\{Q_0[n-2], Q_0[n-3], \ldots, Q_0[1], simem\}$ and $D_1=\{Q_1[n-2], Q_1[n-3], \ldots, Q_1[1], \overline{simem}\}$. The most significant output bit $Q_0[n-1]$ and the inverted bit $\overline{Q}_1[n-1]=Q_0[n-1]$ are delivered back to the BIST controller 30' for evaluation.

In the embodiment of FIG. 6, BIST controller 40 is supposed to test two virtual memories at the same time by providing a single bit test to both memories, and by evaluating a single bit test response from each virtual memory. For the purpose of this arrangement the serialized BIST controller 40 is equipped with a single-bit comparator (not shown) for each output port of the CsRAM 10.

The serial CsRAM BIST 40 works as follows. When bist-en is received and biston is generated on line 39, the BIST mode is enabled and sets memSel=0 to test the lower half $S_0$ of the CsRAM 10 through port $p_0$, and test the upper half $S_1$ of the CsRAM 10 through port $p_1$. A single bit test data simem is generated by controller 30 and is provided at $p_0$ while $\overline{simem}$ is provided at $p_1$ as explained above. The $Q_0/D_0$ and $Q_1/D_1$ provide (n–1) feedbacks in collar 25' for performing the shift operation of the serial test. The most significant output bits $Q_0[n-1]$ and $\overline{Q}_1[n-1]$ are evaluated by the BIST controller 30' in parallel. Due to the inversions on both input inverter 41 an output inverter 44, the test responses from both ports are always identical, i.e. $Q_0[n-1]=Q_1[n-1]$. When this test completes, the BIST controller 30' sets memSel=1 to test the lower half $S_0$ of the memory space through port $p_1$. When the second test is completed, it sets bist_done=1 and sets bist_pass accordingly.

Compared to a conventional BIST controller, the CsRAM serial BIST 40 requires (r+c+2) extra invertors in collar 25', plus a few gates in the BIST controller 30' for evaluating two output bits of identical value. As discussed above, the most significant output bits are compared, i.e. $Q_0[n-1]=\overline{Q}_1[n-1]$, and this is different from the one bit output in the conventional S-MARCH implementation.

In terms of test time, the serial test according to the invention requires the same amount of time as for the conventional testing of a single port sRAM of the same size. As compared to a 2-port sRAM conventional test, the test time according to the embodiment of FIG. 6 is only half.

Figure 7:
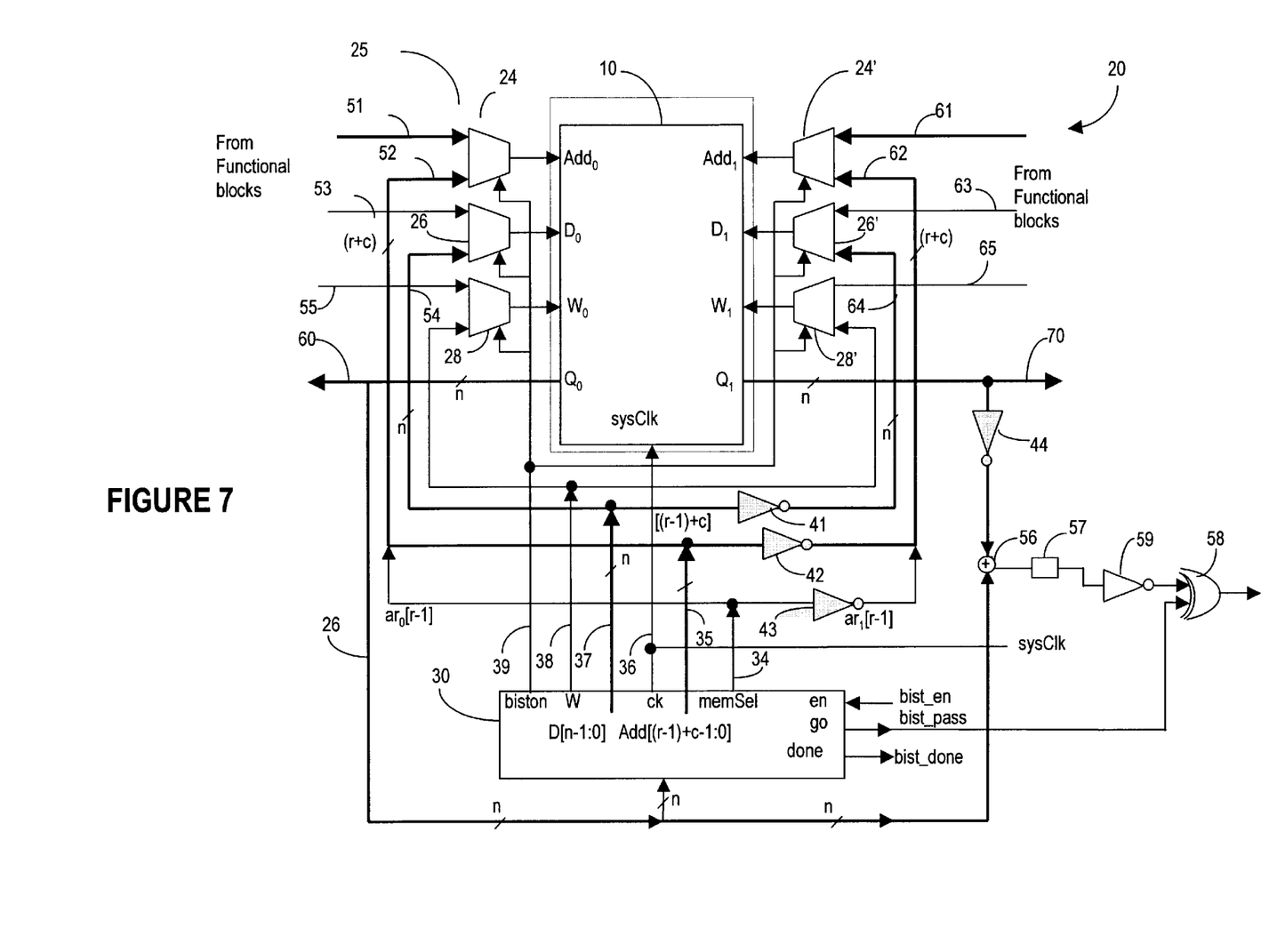
FIG. 7 shows another embodiment of the BIST collar of FIG. 5 with a local comparator.

The embodiment of FIG. 7 shows a modification of the collar 25 of FIG. 5 to be used with a BIST controller 30 designed to generate n-bit wide test data, and to check n-bit wide test responses.

A first set of n-bit wide test responses on line 60, to be compared in the BIST controller 30 as discussed before in connection with FIG. 5, and also inputed to adder 56. The other set of n-bit wide test responses on line 70 are directed to adder 56. Detector 57 connected to the output of adder 56 is a (1;0) detector which sets its output to "1" and remains to be "1" whenever a mismatch between the two sets of test responses is detected.

The output of the detector 57 controls the input of an AND gate 58 through inverter 59, while signal bist_pass controls the other input of the AND gate 58. The output of the AND gate 58 provides signal bist_pass_combined which is "1" if no fault was detected in the memory.

The BIST collar configuration of FIG. 7 can be used with a serial BIST implementation as well.

Figure 8:
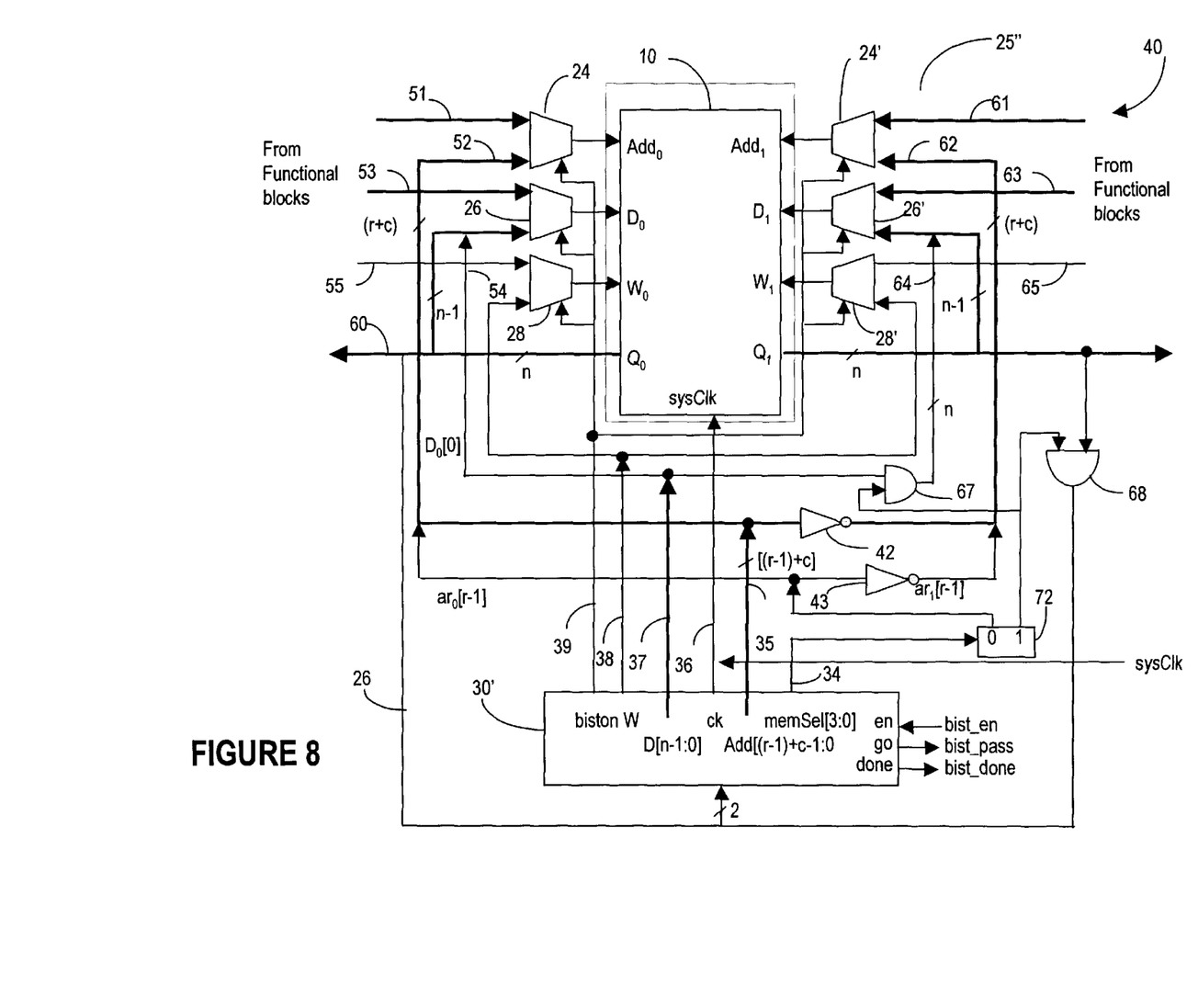
FIG. 8 shows still another embodiment of the BIST collar of FIG. 5 for improved fault coverage test.

FIG. 8 shows another embodiment of the BIST collar 25 including an encoder 72 having an output-0 and an output-1, and two XOR gates 67, 68 replacing inverters 41 and 44 of FIG. 5, respectively. With the configuration shown in FIG. 8, the BIST controller 30 is designed to carry out the following functions for a 2-port, "w" word, n-bit per word CsRAM 10: (a) to test four virtual single port memories with "w/2" words and 2n-bit per word each, and (b) to test one virtual memory at the time. Therefore, 4-bit memory selection signals are generated, e.g. memSel [3:0], for testing each section 85, 86 of the memory 10 four times.

The encoder 72 is coupled to memSel [3:0] on line 34 and controls the selection of either identical or complementary test data. As well, encoder 72 controls which section 85 or 86 is to be tested, and the port $p_0$ or $p_1$ to be used. For example, when output-1 connected to the data bus is "0", the test is performed with identical data in two sessions corresponding to the two sections of the CsRAM 10 selected through output-0. When the output-1 of the encoder 72 is "1", the test is performed with complementary test data, as explained in connection with FIG. 5.

Output-0 of the encoder 72 is used to select which section of the memory 10 is to be tested and from which port $p_0$ or $p_1$. When output-0 is "0", $p_0$ tests section 85 and $p_1$ tests section 86. Otherwise, $p_0$ tests section 86 and $p_1$ tests section 85.

In this way each section of the CsRAM 10 is tested four times: twice with identical test data when output-1=0, and twice with complementary test data when output-1=1, for a complete fault coverage. Table 1 illustrates the function of the encoder 72.

TABLE 1

| memSel [3:0] | Output-0 | Output-1 |
|---|---|---|
| 0 0 0 1 | 0 | 0 |
| 0 0 1 0 | 1 | 0 |
| 0 1 0 0 | 0 | 1 |
| 1 0 0 0 | 1 | 1 |

The BIST collar configuration of FIG. 8 can be used with a serial BIST implementation as well.

According to the invention, a novel BIST approach to achieve at-speed testing quality for compact sRAMs 10, having a working speed at least "k" times faster than the system clock generator 12 is provided. As seen before, testing of CsRAMs can be implemented with a conventional BIST controller 30, 30' with all the required modification contained in a memory collar 25, 25'. The only costs involved are simply related to the collar 25, 25' around the CSRAM 10 under test, for implementing a parallel or a serial testing, respectively.

For testing a 2-port CsRAM of "w" words and "n" bits per word per port, "r" rows and "c" columns, the collar of a conventional BIST controller is adapted as if it were to test two virtual single port sRAMs of "w/2" words, "n" bits per word per port, (r–1) rows and "c" column, with complementary test data. Depending on the partition model the virtual single port sRAM may also have w/2 words, "n" bits per word per port, "r" rows and (c–1) columns. The BIST collar may be modified for testing four virtual single port memories with both complementary and identical test data.

The test schedule of a k-port CsRAM is to simultaneously test "k" virtual memories. Preferably, the virtual memories are of the same size.

Numerous modifications, variations, and adaptations may be made to the particular embodiments of the invention without departing from the scope of the invention which is defined in the appended claims.

What is claimed is:

1. A method for testing a 2-port compact static random access memory (CsRAM) at the working speed of said CsRAM, comprising:

generating a first set of test data and a second set of test data;

simultaneously writing said first set of test data in a first section of said CsRAM through a first port, and said second set of test data in a second section of said CsRAM through a second port;

reading a first output data from said first section through said first port and a second output data from said second section through said second port;

comparing each of said first output data and said second output data with said respective first and second set of test data and declaring a fault whenever said first output data differs from said first set of test data, or said second output data differs from said second set of test data;

simultaneously writing said first set of test data in said second section of said CsRAM through said first port, and said second set of test data in said first section through said second port;

reading said first output data from said second section through said first port and said second output data from said first section through said second port; and comparing again each of said first output data and said second output data with said respective first and second set of test data and declaring a fault whenever said first output data differs from said first set of test data or said second output data differs from said second set of test data.

2. A method as claimed in claim 2, wherein said step of generating comprises:

generating "w/2" first words for said first set of test data; and providing "w/2" second words for said second set of test data, each second word having a binary value complementary to the value of a corresponding first word.

3. A method as claimed in claim 2, wherein said step of simultaneously writing comprises:

writing said first words at successive increasing addresses in said first section; and writing said second words at successive decreasing addresses in said second section.

4. A method as claimed in claim 3, wherein said step of reading comprises:

reading said first words from successive increasing addresses in said first section; and reading said second words from successive decreasing addresses in said second section.

5. A method as claimed in claim 2, wherein said step of simultaneously writing comprises:
   writing said first words at successive decreasing addresses in said first section; and
   writing said second words at successive increasing addresses in said second section.

6. A method as claimed in claim 5, wherein said step of reading comprises:
   reading said first words from successive decreasing addresses in said first section; and
   reading said second words from successive increasing addresses in said second section.

7. A method as claimed in claim 1, wherein said steps of writing comprises a step of writing comprises 1-bit test data at a time and said steps of reading comprises a step of reading 1-bit test results at a time.

8. A method as claimed in claim 1, wherein said steps of writing comprises a step of writing one word at a time and said steps of reading comprises a step of reading one word at a time.

9. A method as claimed in claim 1, for a multi-port CsRAM.

10. A method as claimed in claim 1, wherein said first section and said second section are each half the CsRAM size.

11. A method as claimed in claim 1, wherein said first set of test data comprises data identical to said second set of test data.

12. A method for testing a 2-port compact static random access memory (CsRAM) at the working speed of said CsRAM, comprising:
   generating a first set of test data and a second set of test data;
   simultaneously writing said first set of test data in a first section of said CsRAM through a first port, and said second set of test data in a second section of said CsRAM through a second port;
   reading a first output data from said first section through said first port and a second output data from said second section through said second port; and
   comparing each of said first output data and said second output data with said respective first and second set of test data and declaring a fault whenever said first output data differs from said first set of test data, or said second output data differs from said second set of test data,
   wherein an address in one of said first and second sections comprises a row number and a column number according to the size of said CsRAM, and wherein the most significant bit of the row address is used as a memory section select signal.

13. A test circuit for a CsRAM with a first and a second port, comprising:
   a first address multiplexer unit for said first port and a second address multiplexer unit for said second port for selecting one of a test address and a system address in a first and respectively a second section of said CsRAM;
   a first data multiplexer unit for said first port and a second data multiplexer unit for said second port for providing one of a test data word and a system data word in said first and respectively said second section;
   a first W/R multiplexer unit for said first port and a second W/R multiplexer unit for said second port, said W/R multiplexer units for providing one of a test write/read instruction and a system write/read instruction for both said first and second sections; and
   a built-in self test (BIST) controller for generating said test address, test data word and test write/read instruction simultaneously on said first and second ports, and for receiving an output data from said CsRAM, to perform testing of said CsRAM at a memory working speed, which is faster than said system clock.

14. A test circuit as claimed in claim 13, wherein each of said first address multiplexer unit and said second address multiplexer unit has (r+c) address connections with said BIST controller for providing a memory section select signal for each respective port, to provide either (r−1) row addresses and "c" column addresses, or "r" row addresses and (c−1) column addresses.

15. A test circuit as claimed in claim 13, wherein said BIST controller comprising:
   "n" input data connections with each of said first data multiplexer unit and said second data multiplexer unit for providing n-bit test words, for each respective port; and
   "2n" output data connections with said CsRAM for receiving n-bit word responses from each respective port.

16. A test circuit as claimed in claim 13, wherein said BIST controller comprising:
   n-bit wide input data connections with each of said first data multiplexer unit and said second data multiplexer unit for providing n-bit test words for each said first and second port; and
   n-bit wide output data connections with said CsRAM for receiving n-bit word responses from said first port, and means for comparing n-bit word responses from said second port with said n-bit word responses from said first port.

17. A test circuit as claimed in claim 15, comprising an address inverter for each said address connection for said second port, and a section selection inverter for said second port, wherein said BIST controller generates said test address for said first section and said address inverter provides a complementary binary value of said test address for said second section.

18. A test circuit as claimed in claim 15, comprising an input data inverter for each said input data connections for said second port, wherein said BIST controller generates said test data for said first section and said input data inverter provides a complementary binary value of said test data for said second section.

19. A test circuit as claimed in claim 15, comprising an output data inverter for each said output data connections for said second port, wherein said output data received by said BIST controller from said first and second sections are identical.

20. A test circuit as claimed in claim 13, wherein, for each respective port, each of said first data multiplexer unit and said second data multiplexer unit has (n−1) input data connections with corresponding (n−1) output data connections from said CsRAM;
   an input test connection from said BIST controller for providing a single bit test data to said CsRAM; and
   wherein said BIST controller has an output test connection with said CsRAM for receiving a most significant output bit from said first port and from said second port, in response to said single bit test data.

21. A test circuit as in claim 20, wherein said single bit test data is applied to the least significant bit of said first and second port.

22. A test circuit as in claim 13, wherein said first section and said second section are each half the CsRAM size.

* * * * *